United States Patent [19]

Lucas

[11] 3,750,146

[45] July 31, 1973

[54] CAPACITIVELY COUPLED REFERENCE SIGNAL AND ASSOCIATED CIRCUITRY PARTICULARLY FOR ANALOG TO DIGITAL, DIGITAL TO ANALOG CONVERTERS AND THE LIKE

[75] Inventor: Paul G. Lucas, Sudbury, Mass.

[73] Assignee: Gordon Engineering Company, Wakefield, Mass.

[22] Filed: Dec. 13, 1971

[21] Appl. No.: 207,440

[52] U.S. Cl.340/347 AD, 340/347 DA, 340/347 C, 340/347 NT, 324/62 R

[51] Int. Cl. .......................................... H03k 13/02

[58] Field of Search.............. 340/347 AD, 347 NT, 340/347 C; 307/251; 328/147, 151; 324/62 R

[56] References Cited

UNITED STATES PATENTS 3,657,563 4/1972 Davis .......................... 340/347 AD

*Primary Examiner*—Thomas A. Robinson
*Attorney*—Gerald Altman et al.

[57] ABSTRACT

A reference source is AC coupled to a converter for selectively providing both positive and negative reference signals to the converter. A reference signal potential is selectively applied to a first side of a first capacitor via a sequence of switches and a second side of the first capacitor is selectively connected to a common signal through a return switch. A first signal is presented at the second side of the first capacitor when a first swi tch of the sequence of switches and the return switch are closed. A second signal is presented at the second side of the first capacitor when the first and return switches are opened and a second switch of the sequence of switches is closed. The second signal presented at the second side of the first is the reference signal having a given polarity with respect to the common signal. Automatic zeroing of an offset voltage generated by an integrator and a comparator of the analog to digital converter is provided by a second capacitor serially connected between an input terminal of the integrator and the common signal, the integrator and comparator being connected in a closed loop configuration. A voltage ratio measurement by the analog to digital converter, the ratio of the voltage across a first resistor having a known resistance to the voltage across a second resistor having an unknown resistance, represents the resistance value of the second resistor.

16 Claims, 4 Drawing Figures

CAPACITIVELY COUPLED REFERENCE SIGNAL AND ASSOCIATED CIRCUITRY PARTICULARLY FOR ANALOG TO DIGITAL, DIGITAL TO ANALOG CONVERTERS AND THE LIKE

BACKGROUND OF THE INVENTION

1. Field of Invention

The present invention relates generally to analog to digital and digital to analog converters and, more particularly, is directed towards a capacitively coupled reference source, offset voltage compensating network and a voltage ratio measuring circuit in connection with such converters and the like.

2. Description of the Prior Art

In analog to digital converters adapted for conversion of bipolar signals, reference signals of different polarities are required. Generally, each reference signal is generated by a single reference source. Besides the increased cost in providing at least two precision reference sources, such converters have suffered from the disadvantages that each reference source introduces an additional error. Furthermore, such converters have suffered from the disadvantage that the reference signals and converters are connected to a common ground reference, whereby the converters have limited capabilities with respect to interfacing with external equipment. In alternative reference source embodiments, bipolar reference signals are derived from a zener diode and inverter configuration. Such reference sources have suffered from the disadvantage of limited common mode rejection as a result of having a common ground reference.

SUMMARY OF THE INVENTION

It is an object of the present invention to provide a reference source characterized by AC coupled reference signals, particularly for analog to digital converters, which does not suffer from the heretofore mentioned disadvantages. In one embodiment, the reference source is characterized by a reference signal generated from a common unipolar signal. The reference source comprises a sequence of switching devices, a capacitor and a return switch. Signals derived from a common unipolar signal are selectively applied to a first side of the capacitor via the switching devices. Each switching device presents a unique signal to the first side of the capacitor. A second side of the capacitor is connected to a common via the return switch. When a first switching device and the return switch are closed, a first signal is presented at the second side of the capacitor. When the first switching device and the return switch are opened and a second switching device is closed, a second signal is presented at the second side of the capacitor. The second signal defines a reference signal of a given polarity with respect to the common.

Another object of the present invention is to provide a compensating network for automatic zeroing of an offset voltage generated by an integrator and a comparator of a digital to analog converter. The compensating network is characterized by a capacitor operatively connected between an input terminal of the integrator and a common signal by means of a compensating switch, the integrator and capacitor being connected in a closed loop configuration. During a time interval between adjacent conversion cycles, the compensating switch is energized and the offset voltage is stored on the capacitor. During the conversion cycle, the compensating switch is opened and the stored offset voltage is presented at the input terminal of the integrator. In consequence, the stored offset voltage compensates for the offset voltage generated by the integrator and comparator.

A further object of the invention is to provide an unknown resistance measuring circuit by determining the voltage ratio of a voltage across a first resistor having a known resistance value to a voltage across a resistor having an unknown resistance value. The resistance measuring circuit comprises a calibrated resistor having a known resistance value serially connected between a first terminal to which a voltage is applied and a second terminal at which a voltage is presented. A resistor having an unknown resistance value is serially connected between the second terminal and a return. The ratio of the voltage across the unknown resistor to the voltage across the calibrated resistor is the ratio of the unknown resistance value to the calibrated resistance value.

The invention accordingly comprises the system possessing the construction, combination of elements, and arrangement of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings, wherein.

DETAILED DESCRIPTION OF THE INVENTION

Figure 1:
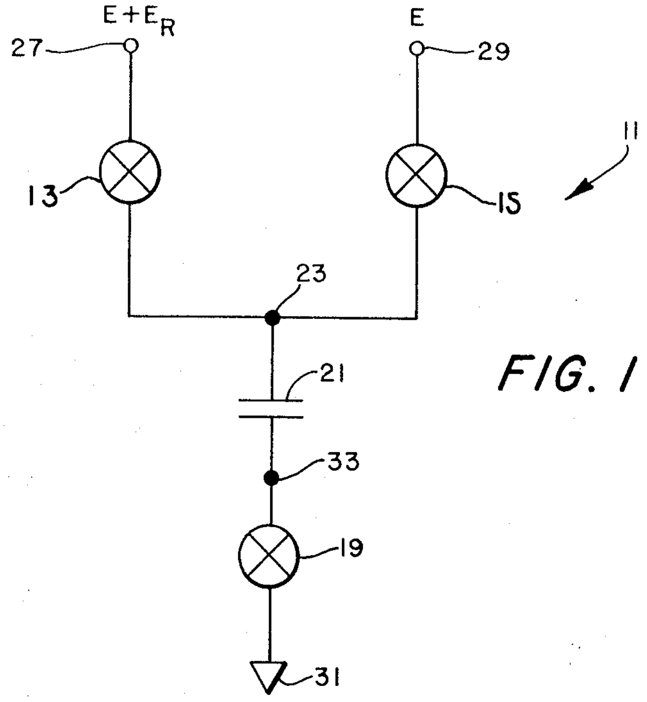
FIG. 1 is a schematic diagram of a reference source embodying the present invention.

Referring now to FIG. 1, there is shown an AC coupled reference source 11 for selectively generating positive and negative reference signals from a unipolar reference signal. Reference source 11 comprises switching devices 13, 15 and 19 and a capacitor 21. One side of each switch 13 and 15 is connected at a common junction 23 which is further connected to one side of capacitor 21. The other side of each switch 13 and 15 is connected to terminals 27 and 29 respectively. Switch 19 is serially connected between the other side of capacitor 21 and a common signal 31, the junction of capacitor 21 and switch 19 being denoted by reference character 33.

For convenience, by way of example, the operation of the reference source will be described as having a voltage $E_r$ applied between terminals 27 and 29 and a voltage E with respect to common signal 31 applied at terminal 29. That is, a voltage $E+E_r$ is presented terminal 27 and a voltage E is presented at terminal 29.

In one mode of operation, initially switches 13 and 19 are closed and switch 15 is opened. The voltage $E+E_r$ which is presented at junction 23 through closed switch 13 is coupled to junction 33 via capacitor 21. Thereafter, switches 13 and 19 are opened and switch 15 is closed. The voltage E is presented at junction 23 through the closed switch 15 and coupled to junction 33 via capacitor 21. In other words, the voltage at junctions 23 and 33 has change from E+$E_r$ to E which is a negative $E_r$ change.

In another mode of operation, initially switches 15 and 19 are closed and switch 13 is opened. The voltage E which is presented at junction 23 through closed switch 15 is coupled to junction 33 via capacitor 21. Thereafter, switches 15 and 19 are opened and switch 13 is closed. The voltage E+$E_r$ is presented at junction 23 through closed switch 15 and coupled to junction 33 via capacitor 21. In other words, the voltage at junctions 23 and 33 has changed from E to E+$E_r$ which is a positive $E_r$ change.

From the foregoing, it will be readily appreciated that, by selectively energizing and deenergizing switches 13, 15, and 19, a bipolar voltage, positive $E_r$ and negative $E_r$, is presented at junction 33. It is to be understood that in alternative embodiments, reference source 11 is AC coupled by means other than capacitive coupling, for example magnetic coupling. An alternative embodiment of reference source 11 is illustrated in FIG. 2 in conjunction with a digital multimeter 10 made in accordance with the teachings of the invention.

Figure 2:
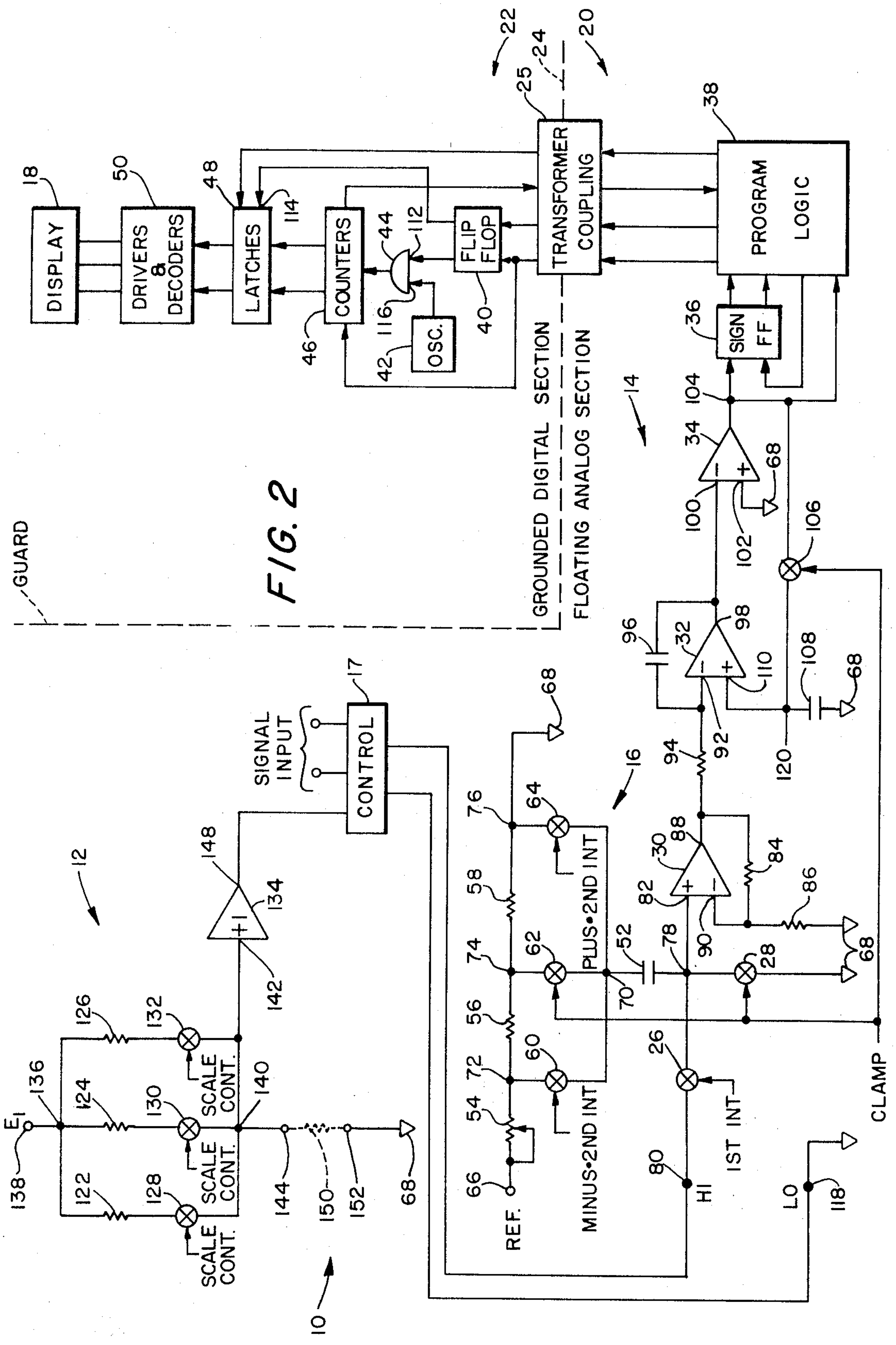
FIG. 2 is a block and schematic diagram of a digital multimeter made in accordance with the teachings of the present invention.

Referring now to FIG. 2, there is shown a digital multimeter 10 which comprises a circuit 12 for measuring an unknown resistance, a converter 14, an AC coupled bipolar reference source 16, a control 17 and a display 18. Control 17, by way of example, includes a plurality of switching devices (not shown) for governing the type of measurement to be made by digital multimeter 10, e.g., resistance, AC voltage, or DC voltage.

Converter 14, for example an analog to digital converter of the dual slope integrator type, is divided into a floating analog section 20 and a grounded digital section 22, the floating and grounded sections being separated by a guard 24. Floating analog section 20 and grounded digital section 22 are connected through a transformer coupling 25. Floating section 20 comprises a series-shunt switch pair 26, 28, a buffer amplifier 30, an integrator 32, a comparator 34, a flip-flop 36, and a program logic 38. Grounded digital section 22 comprises a flip-flop 40, a clock 42, and AND gate 44, a counter 46, a latching circuit 48, and drivers and decoders 50.

Generally, bipolar reference source 16, an alternative embodiment of reference source 11, comprises capacitor 52, variable resistor 54 and fixed resistors 56 and 58; and switches 60, 62 and 64. Resistors 54, 56, and 58 are serially connected between a terminal 66 and a return 68. By way of example, a voltage, approximately 6.2–6.3 volts, is applied at terminal 66 from a reference zener diode (not shown). Resistors 54, 56 and 58 operate to divide the voltage at terminal 66 in such a manner that a voltage 2$E_{ref}$ is presented at a junction 72 and a voltage $E_{ref}$ is presented at a junction 74. One side of each switch 60, 62, and 64 is connected at a junction 70 which is further connected to one side of capacitor 52. The other side of switch 60 is connected to junction 72 of resistors 54 and 56; the other side of the switch 62 is connected to junction 74 of resistors 56 and 58; and the other side of switch 64 is connected to a junction 76 of resistor 58 and return 68. The other side of capacitor 52 is connected to a junction 78 which is also connected to one side of switches 26 and 28.

Switch 26 is serially connected between an input terminal 80 and junction 78. Switch 28 is serially connected between junction 78 and return 68. Junction 78 is connected to a non-inverting input terminal 82 of buffer amplifier 30, the gain of buffer amplifier 30 being governed by resistors 84 and 86. It is to be understood that, in alternative embodiments, reference source 16 is AC coupled to analog to digital converter 14 by means other than a capacitor, for example a transformer. Resistor 84 is serially connected between an output terminal 88 and an inverting input terminal 90 of buffer amplifier 30 and resistor 86 is serially connected between inverting input terminal 90 and return 68. Output terminal 88 of buffer amplifier 30 is connected to an inverting input terminal 92 of integrator 32 via a resistor 94. A capacitor 96 is connected between an output terminal 98 and inverting input terminal 92 of integrator 32. Output terminal 98 of integrator 32 is connected to a first inverting input terminal 100 of comparator 34, a second input terminal 102 of comparator 34 being connected to return 68. As hereinafter described, automatic zeroing of integrator 32 and comparator 34 is provided by means of a switch 106 and a capacitor 108. Capacitor 108 is serially connected between non-inverting terminal 110 and return 68. Switch 106 is serially connected between an output terminal 104 of comparator 34 and a non-inverting input 110 of integrator 32. Output terminal 104 of comparator 34 is connected to flip-flop 36, for example a sign flip-flop, which is further connected to program logic 38.

Program logic 38 is coupled to grounded digital section 22 via transformer coupling 25. Flip-flop 40 receives signals from program logic 38 through transformer coupling 25 and generates signals which are applied to an input terminal 112 of AND gate 44 and an input terminal 114 of latches 48. The signal generated by clock 42, for example a one megahertz oscillator, is applied to an input terminal 116 of AND gate 44. The signal generated from AND gate 44 is applied to counter 46 which is further connected to latches 48. Drivers and decoders 50 are serially connected between latches 48 and display 18. An analog signal which is applied between input terminal 80 and an input terminal 118 is presented in digital form on display 18, for example a plurality of numerical indicator tubes.

For convenience, the operation of analog to digital converter 14 will be described hereinafter as having a first integration portion, a second integration portion, and a clamping portion. During the clamping portion, switches 28, 62, and 106 are energized or in a closed state and switches 26, 60, and 64 are de-energized or in an open state. When switch 106 is closed capacitor 108 is charged to the offset voltage of amplifier 30 and integrator 32, comparator 34 having a negative gain of approximately 10,000 for example. That is, the voltage at a junction 120 of switch 106 and capacitor 108 is given by the expression:

$$E_{01} + E_{02}$$

Where $E_{01}$ is the voltage at output terminal 88 of amplifier 30, and $E_{02}$ is the voltage between input terminals 92 and 110 of integrator 32.

In other words, the charge on capacitor 108 due to the feedback circuit from comparator 34 through switch 106 is such that the voltage terminals 92 and 88 are equal and no current flows through resistor 94.

Figure 4:
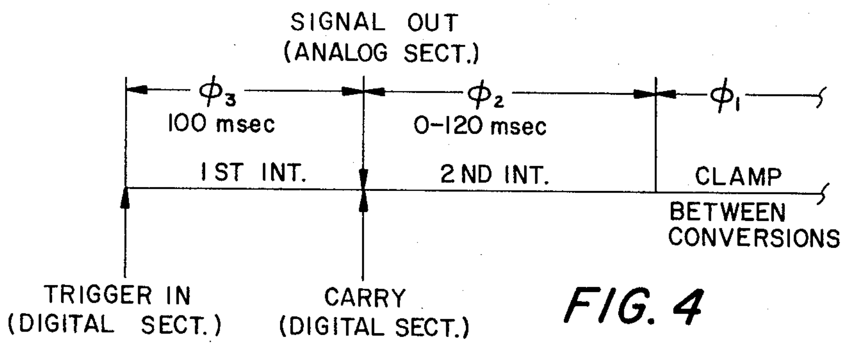
FIG. 4 is a timing diagram illustrating certain principles of the invention.

During the first integration period, switches 28, 60, 62 64, and 106 are de-energized or in the open state and switch 26 is energized or in a closed state. The analog signal applied between input terminals 80 and 118 via control 17 is received at non-inverting input 82 of buffer amplifier 30. As indicated in the timing diagram of FIG. 4, the analog signal is applied to integrator 32 for a preset time, for example 100 milliseconds, which is established by counting the pulses generated from oscillator 42 in counter 46. When the preset count is reached, counter 46 generates a signal to program logic 38 which controls the operation of switches 26, 28, 60, 62, 64 and 106. At the end of the first integration period, the polarity of the signal at the output of comparator 34 is sensed in program logic 38 in order to determine which one of switches 60, 62, and 64 is to be energized for the second integration period. In operation of bipolar reference source 16, switches 62 and 28 are closed during the clamping portion and the voltage $E_{ref}$ is presented at junction 70 and coupled to junction 78 via capacitor 52. At the end of the first integration period when switch 26 is opened, the voltage at junction 78 is switched to the opposite polarity of the unknown analog input so that integrator 32 is discharged during the second integration period. Accordingly, if the voltage at the output of comparator 34 is positive, switch 64 is energized and return 68 is connected to junction 70. In consequence, there is a negative $E_{ref}$ change at junction 70 and the voltage presented at junction 78 is a negative reference voltage $-E_{ref}$. If the voltage at the output of comparator 34 is negative, switch 60 is energized and the voltage $2E_{ref}$ is connected at junction 70. In consequence, there is a positive $E_{ref}$ change at junction 70 and the voltage presented at junction 78 is a positive reference voltage $+E_{ref}$. During the second integration period the selected reference voltage at junction 78, either positive or negative reference, is applied to integrator 32 via buffer amplifier 30 until a signal at the output terminal 104 of comparator 34 changes state. That is, when the voltage at input terminals 100 and 102 of comparator 34 are equal, the signal at terminal 104 changes state and an end of conversion signal is generated by program logic 38. The time required to discharge integrator 32 during the second integration is recorded by counter 46. The number of counts recorded on counter 46, i.e., the number of pulses generated by oscillator 42 during the second integration period, represents the magnitude of the unknown analog input signal. The count recorded in counter 46 is applied to display 18 via latches 48 and drivers and decoders 50, the signal presented on display 18 being the magnitude of the unknown analog input signal in digital form.

Resistance ratio measuring circuit 12 comprises calibrated resistors 122, 124 and 126; switches 128, 130, and 132; and a buffer amplifier 134. One side of each resistor 122, 124, and 126 is connected at a junction 136 which is further connected to a terminal 138 having a voltage $E_1$ applied thereto. The other side of each resistor 122, 124, and 126 is respectively connected to one side of switches 128, 130, 132. The other side of each switch 128, 130, 132 is connected to a junction 140 which is further connected to an input terminal 142 of amplifier 134 and a terminal 144. In the illustrated embodiment, amplifier 134 is a follower having a gain of one. An output terminal 148 of amplifier 134 is further connected to control 17. A resistor 150 having an unknown resistance is serially connected between terminal 144 and a terminal 152 which is further connected to return 68. As hereinafter described the operation of resistance ratio measurement circuit 12 is such that the unknown resistance measurement is obtained independent of voltage $E_1$. In describing the operation of resistance ratio measuring circuit 12, by way of example, the voltage at terminal 138 is designated $E_1$, the voltage at terminal 144 is designated $E_2$. A voltage $E_m$ is defined as the difference between voltage $E_1$ and the voltage $E_2$. That is, $E_m=E_1-E_2$. Resistors 122 and 150 are denoted by the reference characters $R_c$ and $R_x$, respectively. Accordingly, the following equation may be written for $E_2$.

$$E_2 =(R_x E_1)/(R_x + R_c) \tag{1}$$

Since $$E_m = E_1 - E_2$$

Then $$(E_2/E_m) = (E_2/E_1 - E_2) \tag{2}$$

Substituting equation (1) into equation (2) yields $$(E_2/E_m) = (R_xE_1/R_x + R_c)/(E_1 - R_xE_1/R_x + R_c) \tag{3}$$

Simplifying equation (3) yields $$(E_2/E_m) = (R_x/R_c) \tag{4}$$

From the foregoing, it will be realized that the ratio of the voltage $E_2$ to the voltage $E_m$ is the ratio of the unknown resistance $R_x$ to the calibrated resistance $R_c$ and is independent of the voltage $E_1$. In other words, the accuracy of the measurement for determining the resistance of resistor $R_c$ is independent of the stability of voltage $E_1$. The details of a resistance ratio measuring circuit which operates in a manner similar to resistance ratio measuring circuit 12, hereinbefore described in connection with FIG. 2, is shown in FIG. 3 at 160.

Figure 3:
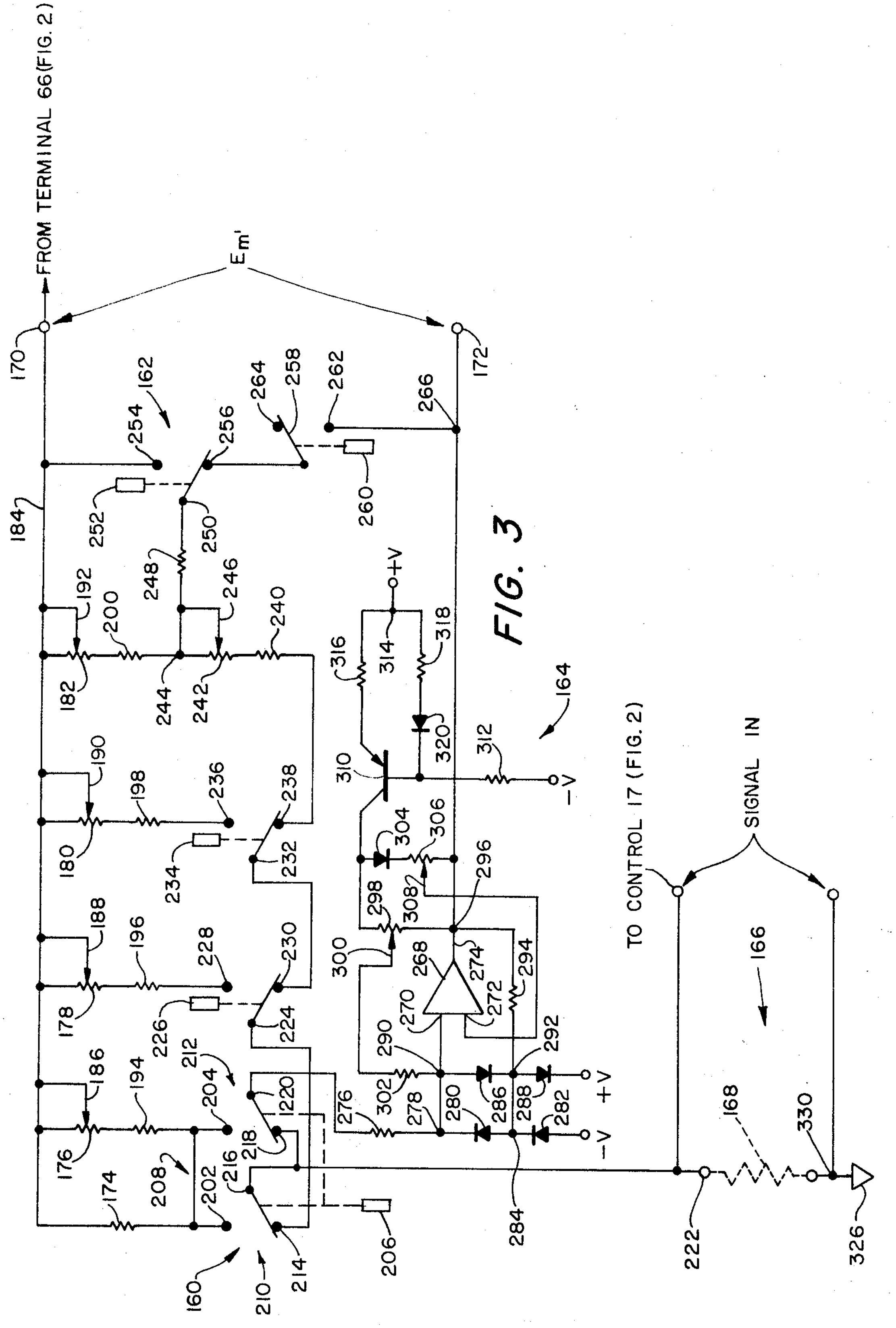
FIG. 3 is a detailed schematic diagram of the resistance measuring circuit of FIG. 2.

Referring now to FIG. 3, it will be seen that resistance ratio measuring circuit 160 comprises a calibrated resistor section 162, an amplifier section 164, and an input section 166 for receiving a resistor 168 having an unknown resistance. Calibrated section 162 includes a pair of terminals 170 and 172 for receiving a voltage $E_m$ which corresponds to voltage $E_m$. Terminal 170 is connected to one side of a fixed resistor 174 and one side of variable resistors 176, 178, 180 and 182 via a line 184. Wiper arms 186, 188, 190 and 192 of resistors 176, 178, 180, and 182, respectively, are connected also to line 184. The other side of each resistor 176, 178, 180, and 182 is connected to one side of fixed resistors 194, 196, 198, and 200, respectively. The other sides of resistors 174 and 194 are connected respectively to normally open contacts 202 and 204 of a relay 206, contacts 202 and 204 being connected together as shown at 208. In the illustrated embodiment, relay 206 is shown as having sections 210 and 212. Section 210 includes normally opened contact 202, a normally closed contact 214 and a contactor 216; and section 212 includes normally opened contact 204, a normally closed contact 218 and a contactor 220. Contactor 216 is connected to normally closed contact 218 and a terminal 222. Normally closed contact 214 is connected to a contactor 224 of a relay 226 having a normally opened contact 228 and a normally closed contact 230. The other side of resistor 196 is connected to normally opened contact 228. Normally closed contact 230 is connected to a contactor 232 of a relay 234 having a normally opened contact 236 and a normally closed contact 238. A fixed resistor 240 and a variable resistor 242 are serially connected between normally closed contact 238 at a junction 244 which is further connected to the other side of resistor 200. A wiper arm 246 of variable resistor 242 is connected also to junction 244. A resistor 248 is serially connected between junction 244 and a contactor 250 of a relay 252 having a normally opened contact 254 and a normally closed contact 256. Normally opened contact 254 is connected to line 184. Normally closed contact 256 is connected to a contactor 258 of a relay 260 having a normally opened contact 262 and a normally closed contact 264. Normally opened contact 262 is connected to a junction 266 which is further connected to terminal 172. Junction 266 is also connected to amplifier 164.

Amplifier section 164 includes an operational amplifier 268 having a non-inverting terminal 270, an inverting input terminal 272 and an output terminal 274. Non-inverting terminal 270 is connected to contactor 220 through a resistor 276, the junction of non-inverting input terminal 270 and a resistor 276 being shown at 278. A pair of diodes 280 and 282 are serially connected between a minus voltage, −V, and junction 278. The anode and cathode of diodes 280 and 282, respectively, are connected together at a junction 284. A pair of diodes 286 and 288 are serially connected between the positive voltage, +V, and a junction 290 which is further connected to junction 278 and non-inverting input 270. In the illustrated embodiment, by way of example, +V and −V are plus and minus fifteen volts, respectively. The cathode and anode of diodes 286 and 288, respectively, are connected at a junction 292 which is further connected to junction 284. A resistor 294 is serially connected between junction 292 and output terminal 274 at a junction 296. One side of a variable resistor 298 having a wiper arm 300 is connected to a junction 296, wiper arm 300 being connected to junction 290 through a resistor 302. The other side of variable resistor 298 is connected to the anode of a diode 304, the cathode of diode 304 being connected to one side of a variable resistor 298 is connected to the anode of a diode 304, the cathode of diode 304 being connected to one side of a variable resistor 306 having a wiper arm 308. The other side of variable resistor 306 is connected to junction 296 and wiper arm 308 is connected to non-inverting input terminal 272. The anode of diode 304 is connected also to the collector of a transistor 310, for example a PNP transistor. The base of transistor 310 is connected to −V through a resistor 312. The emitter of transistor 310 is connected to −V through a resistor 312. The emitter of transistor 310 is connected to a junction 314 through a serially connected fixed resistor 316, +V being applied to junction 314. A fixed resistor 318 and a diode 320 are serially connected between junction 314 and the base of transistor 310, the cathode of diode 320 being connected at the junction of resistor 312 and the base of transistor 310.

The operation of resistance ratio measuring circuit 160 when resistor 168 having an unknown resistance is connected between terminal 222 and a terminal 330, which is further connected to return 326, is similar to that described in connection with FIG. 2.

Since certain changes may be made in the foregoing disclosure without departing on the scope of the invention herein involved, it is intended that all matter contained in the above description and depicted in the accompanying drawings be construed in an illustrative and not in a limiting sense.

Having thus described the invention, what is claimed and desired by Letters Patent of the United States is:

1. A device for presenting a reference signal with respect to a return signal, said device comprising:

a. capacitor means having first and second terminal means;

b. first switch means having first and second switching states, said first switch means operatively connected to said first terminal means for selectively and independently applying at least first and second signals to said first terminal means; and c. second switch means having opened and closed switching states, said second switch means operatively connected to said second terminal means for selectively applying a return signal to said second terminal means;

d. said first signal applied to said first terminal means and coupled to said second terminal means through said capacitor means when said first switch means is in said first switching state and said second switch means is in said closed switching state, said second signal applied to said first terminal means when said first switch means is in said second switching state and said second switch means is in said opened state, a reference signal presented at said second terminal means when said second signal is applied to said first terminal means, said reference signal being the difference between said first and second signals with respect to said return signal.

2. A device for presenting a reference signal with respect to a return signal, said device comprising:

a. first switch means having first and second terminal means, said first terminal means adapted for reception of a first signal;

b. second switch means having third and fourth terminal means, said third terminal means adapted for reception of a second signal, said second and fourth terminal means connected at a first junction;

c. capacitor means having fifth and sixth terminal means, said fifth terminal means connected to said first junction; and d. third switch means having seventh and eighth terminal means, said sixth and seventh terminal means connected at a second junction, said eighth terminal means adapted for reception of a return signal;

e. said first signal applied to said first junction and coupled to said second junction through said capacitor means when said first and third switch means are closed and said second switch means is opened, said return signal applied to said second junction when said third switch means is closed;

f. said second signal applied to said first junction when said first and third switch means are opened and said second switch means is closed, a reference signal presented at said second junction when said second signal is applied to said first junction, said reference signal being the difference between said first and second signals with respect to said return signal.

3. A device for presenting a reference signal with respect to a return signal, said device comprising:

a. first switch means having first and second terminal means, said first terminal means adapted for reception of a first signal;

b. second switch means having third and fourth terminal means, said third terminal means adapted for reception of a second signal;

c. third switch means having fifth and sixth terminal means, said fifth terminal means adapted for reception of a third signal;

d. said second, fourth and sixth terminal means connected at a first junction;

e. capacitor means having seventh and eighth terminal means, said seventh terminal means connected to said first junction;

f. fourth switch means having ninth and tenth terminal means, said eighth and ninth terminal means connected at a second junction, said tenth terminal means adapted for reception of a return signal;

g. said second signal applied to said first junction and coupled to said second junction through said capacitor means when said second and fourth switch means are closed and said first and third switch means are opened, said return signal applied to said second junction when said fourth switch means is closed;

h. a first reference signal presented at said second junction when said second and fourth switch means are opened and said first switch means is closed and a second reference signal presented at said second junction when said second and fourth switch means are opened and said third switch means is closed, said first reference signal being the difference between said first and second signals with respect to said return signal, said second reference signal being the difference between said second and third signals with respect to said return signal.

4. A device for presenting an analog signal in digital form, said device comprising:

a. first and second terminal means adapted for reception of an analog signal;

b. converter means having third, fourth, fifth and sixth terminal means, said third and fourth terminal means defining first input terminal means, said fifth and sixth terminal means defining first output terminal means, said first and third terminal means connected at a first junction, said second and fourth terminal means connected at a second junction adapted for interconnection with a return signal; and c. AC coupled reference source means operatively connected to said first junction for selectively applying a reference signal thereto;

d. said analog signal at said first input terminal means being presented at said first output terminal means in digital form.

5. The device as claimed in claim 4 wherein said reference source includes:

a. first capacitor means having seventh and eighth terminal means, said eighth terminal means connected to said first junction;

b. first switch means having first and second switching states, said first switch means operatively connected to said seventh terminal means for selectively and independently applying at least first and second signals to said seventh terminal means; and c. second switch means having opened and closed switching states, said second switch means operatively connected between said first and second junctions for selectively applying said return signal to said eighth terminal means;

d. said first signal applied to said seventh terminal means and coupled to said first junction through said first capacitor means when said first switch means is in said first switching state and said second switch means is in said closing switching state, said second signal applied to said seventh terminal means when said first switch means is in said second switching state and said second switch means is in said opened state, a reference signal presented at said first junction when said second signal is applied to said seventh terminal means, said reference signal being the difference between said first and second signals with respect to said return signal.

6. The device as claimed in claim 5 wherein said converter means is closed loop converter means including:

a. integrator means having ninth, tenth and eleventh terminal means, said ninth and tenth terminal means defining second input terminal means, said eleventh terminal means defining second output terminal means, said tenth terminal means operatively connected to said first junction;

b. comparator means having twelfth, thirteenth and fourteenth terminal means said twelfth and thirteenth terminal means defining third input terminal means, said fourteenth terminal means defining third output terminal means, said twelfth terminal means operatively connected to said eleventh terminal means, said twelfth terminal means operatively connected to said return signal;

c. second capacitor means having fifteenth and sixteenth terminal means, said fifteenth terminal means operatively connected to said tenth terminal means, said sixteenth terminal means connected to said return signal; and d. third switch means having third and fourth switching states, said third switch means serially connected between said fourteen and fifteenth terminal means for selectively applying an offset signal of said integrator means and comparator means as at said fourteenth terminal means to said second capacitor means when said third switch means is in said third switching state, said second capacitor means storing said offset signal when said third switch means is in said third switching state, said second capacitor means being disconnected from said fourteenth terminal means when said third switch means is in said fourth switching state, said offset signal stored on said capacitor being applied to said tenth terminal means when said third switch means is in said fourth switching state, said stored offset signal applied to said tenth terminal means operating to compensate for said offset signal of said integrator and comparator means.

7. The device as claimed in claim 6 including sampling means operatively connected to said fourteenth terminal means and said first and second switch means for selectively controlling the switching states of said first and second switch means as a function of a signal presented at said third output terminal means.

8. A device for providing positive and negative reference signals, said device comprising:

a. first means having at least first, second and third terminal means, said first and second terminal means adapted for reception of first and second signals, said first means operating in first and second sequences for selectively presenting said first and second signals at said third terminal means, said first sequence defined by first presenting said first signal at said third terminal means and then presenting said second signal at said third terminal means, said second sequence defined by first presenting said second signal at said third terminal means and then presenting said first signal at said third terminal means;

b. output terminal means;

c. second means AC coupling said third terminal means and said output terminal means, a positive reference signal presented at said output terminal means when said first means is operated in said first sequence, a negative reference signal presented at said output terminal means when said first means is operated in said second sequence.

9. A device as claimed in claim 8 wherein said second means is capacitive coupling means.

10. The device as claimed in claim 8 wherein said second means is magnetic coupling means.

11. A device for converting an analog signal to digital form, said device comprising:

a. converter means having at least first input and first output terminal means, said input terminal means adapted for reception of an analog signal; and b. reference source means AC coupled to said converter means and adapted for selectively generating positive and negative reference signals for use by said converter means in converting said analog signal to digital form, said reference source means having first and second states, said positive reference signal coupled to said converter means when said reference source means is in said first state and said negative reference signal coupled to said converter means when said reference source means is in said second state, said first and second states determined by said analog signal;

c. said analog signal at said first input terminal means being presented at said first output terminal means in digital form.

12. A device for converting an analog signal to digital form, said device comprising:

a. converter means having at least first input and first output terminal means, said input terminal means adapted for reception of an analog signal; and b. reference source means AC coupled to said converter means and adapted for selectively generating positive and negative reference signals for use by said converter means in converting said analog signal to digital form, said reference source means including first means having at least first, second and third terminal means, said first and second terminal means adapted for reception of first and second signals, said first means operating in first and second sequences for selectively presenting said first and second signals at said third terminal means, said first sequence defined by first presenting said first signal at said third terminal means and then presenting said second signal at said third terminal means, said second sequence defined by first presenting said second signal at said third terminal means and then presenting said first signal at said third terminal means, second output terminal means, said second means AC coupling said third terminal means and said second output terminal means, a positive reference signal presented at said second output terminal means when said first means is operated in said first sequence, a negative reference signal presented at said second output terminal means when said first means is operated in said second sequence;

c. said analog signal at said first input terminal means being presented at said first output terminal means in digital form.

13. A device for converting a digital signal to analog form, said device comprising:

a. converter means having at least first input and first output terminal means, said input terminal means adapted for reception of a digital signal; and b. reference source means AC coupled to said converter means and adapted for selectively generating positive and negative reference signals for use by said converter means in converting said digital signal to analog form, said reference source means having first and second states, said positive reference signal coupled to said converter means when said reference source means is in said first state and said negative reference coupled to said converter means when said reference means is in said second state, said first and second states determined by said digital signal;

c. said digital signal at said first input terminal means being presented at said first output terminal means in analog form.

14. A device for converting a digital signal to analog form, said device comprising:

a. converter means having at least first input and first output terminal means, said input terminal means adapted for reception of a digital signal; and b. reference source means AC coupled to said converter means and adapted for selectively generating positive and negative reference signals for use by said converter means in converting said digital signal to analog form, said reference source means including first means having at least first, second and third terminal means, said first and second terminal means adapted for reception of first and second signals, said first means operating in first and second sequences for selectively presenting said first and second signals at said third terminal means, said first sequence defined by first presenting said first signal at said third terminal means and then presenting said second signal at said third terminal means said second sequence defined by first presenting said second signal at said third terminal means and then presenting said first signal at said third terminal means, second output terminal means, and second means AC coupling said third terminal means and said second output terminal means, a positive reference signal presented at said second output terminal means when said first means is operated in said first sequence, a negative reference signal presented at said second output terminal means when said first means is operated in said second sequence;

c. said digital signal at said first input terminal means being presented at said first output terminal means in analog form.

15. A converter for changing a signal from an input form to an output form, one of said input form and said output form being analog, the other of said input form and said output form being digital, said converter comprising first means responsive to at least a reference signal and at least an unknown signal; reference source means having first and second states, said reference source means generating a positive reference signal when in said first state and a negative reference signal when in said second state, said first and second states determined by the polarity of said unknown signal; and second means for AC coupling said reference signal generated by said reference source means to said first means.

16. A device for presenting a reference signal with respect to a return signal, said device comprising:

a. capacitor means having first and second terminal means;

b. first means having first and second states, said first means operatively connected to said first terminal means for selectively and independently applying at least first and second signals to said first terminal means; and c. second means having first and second states, said second means operatively connected to said second terminal means for selectively applying a return signal to said second terminal means;

d. said first signal applied to said first terminal means and coupled to said second terminal means through said capacitor means when said first means is in said first state and said second means is in said second state, said second signal applied to said first terminal means when said first means is in said second state and said second means is in said first state, a reference signal presented at said second terminal means when said second signal is applied to said first terminal means, said reference signal being the difference between said first and second signals with respect to said return signal.

* * * * *